US009025298B2

(12) United States Patent
Zhou et al.

(10) Patent No.: US 9,025,298 B2
(45) Date of Patent: May 5, 2015

(54) ELECTRICAL SWITCHING APPARATUS INCLUDING TRANSDUCTOR CIRCUIT AND ALTERNATING CURRENT ELECTRONIC TRIP CIRCUIT

(71) Applicant: Eaton Corporation, Cleveland, OH (US)

(72) Inventors: Xin Zhou, Franklin Park, PA (US); Harry J. Carlino, Export, PA (US); Brian S. Caffro, Aliquippa, PA (US)

(73) Assignee: Eaton Corporation, Cleveland, OH (US)

( * ) Notice: Subject to any disclaimer, the term of this patent is extended or adjusted under 35 U.S.C. 154(b) by 57 days.

(21) Appl. No.: 14/100,214

(22) Filed: Dec. 9, 2013

(65) Prior Publication Data
US 2014/0111294 A1    Apr. 24, 2014

Related U.S. Application Data

(63) Continuation-in-part of application No. 13/657,144, filed on Oct. 22, 2012.

(51) Int. Cl.
*H01H 71/12*     (2006.01)
*H02H 7/26*      (2006.01)
(Continued)

(52) U.S. Cl.
CPC ............ *H01H 71/125* (2013.01); *H02H 7/268* (2013.01); *H02J 1/00* (2013.01); *G01R 19/20* (2013.01); *H01H 71/12* (2013.01)

(58) Field of Classification Search
CPC ..... H01H 71/125; H01H 71/12; G10R 19/20; H02J 1/00; H02H 7/268
USPC ......................................... 361/115
See application file for complete search history.

(56) References Cited

U.S. PATENT DOCUMENTS

| 3,136,948 A | * | 6/1964 | Windsor | ........................ 324/127 |
| 3,475,620 A | | 10/1969 | Murray et al. | |
| 5,223,789 A | * | 6/1993 | Katsuyama et al. | ........... 324/127 |

(Continued)

FOREIGN PATENT DOCUMENTS

| CA | 1 293 022 C | 12/1991 |
| DE | 37 24 116 A | 2/1988 |

(Continued)

OTHER PUBLICATIONS

European Patent Office, "International Search Report and Written Opinion", Jan. 21, 2015, 13 pp.

*Primary Examiner* — Scott Bauer (74) *Attorney, Agent, or Firm* — Eckert Seamans Cherin & Mellott, LLC; Nathaniel C. Wilks (57) ABSTRACT

An electrical switching apparatus includes a transductor circuit that senses a direct current between at least one input terminal and at least one output terminal and outputs an alternating current proportional to the direct current between the input terminal and the output terminal. The electrical switching apparatus also includes an alternating current electronic trip circuit configured to control pairs of separable contacts to separate based on the alternating current output from the transductor circuit. The alternating current electronic trip circuit includes a rectifier circuit, an interface circuit, and a processor structured to output a control signal to control a trip actuator to cause an operating mechanism to separate the plurality of pairs of separable contacts.

18 Claims, 8 Drawing Sheets

(51) Int. Cl.
*H02J 1/00* (2006.01)
*G01R 19/20* (2006.01)

(56) References Cited

U.S. PATENT DOCUMENTS 5,615,075 A    3/1997   Kim
7,176,673 B2 *  2/2007  Tsubota et al. ............... 324/127
2012/0138442 A1  6/2012  Beatty et al.

FOREIGN PATENT DOCUMENTS

EP    2 234 136 A1    9/2010
EP    2 461 345 A2    6/2012
GB      883 660 A    12/1961

\* cited by examiner

ELECTRICAL SWITCHING APPARATUS INCLUDING TRANSDUCTOR CIRCUIT AND ALTERNATING CURRENT ELECTRONIC TRIP CIRCUIT

CROSS-REFERENCE TO RELATED APPLICATION

This is a Continuation-In-Part (CIP) Application which claims the benefit of priority to U.S. patent application Ser. No. 13/657,144 filed on Oct. 22, 2012, entitled "Electrical Switching Apparatus Including Transductor Circuit and Alternating Current Electronic Trip Circuit", which is currently pending and the entirety of which is incorporated herein by reference.

BACKGROUND

1. Field

The disclosed concept pertains generally to electrical switching apparatus and, more particularly, to circuit breakers including a plurality of separable contacts.

2. Background Information

Circuit breakers have been used in alternating current (AC) applications and direct current (DC) applications. The applications for DC circuit breakers have been very small. With the larger use of alternative energy sources, such as photovoltaic applications, the DC applications are increasing. DC molded case circuit breakers have used mechanical thermal and magnetic trip units for overload and short circuit protection, while some DC air circuit breakers employ electronic trip units. Magnetic trip units instantaneously trip the circuit breaker when the current in the protected circuit exceeds a predetermined level. However, magnetic trip units are difficult to calibrate and are not as accurate as electronic trip units. Thermal trip units are less susceptible to nuisance tripping, but take a longer amount of time to trip the circuit breaker, and are susceptible to ambient thermal conditions causing accuracy problems. Because of these problems thermal and magnetic trip units are not typically used in the larger size and higher current rated circuit breakers in AC applications, but rather, AC electronic trip units, which use a current transformer to sense the AC current, are used.

Without a time varying magnetic field, the AC current transformer will produce no electromotive force with DC current, which makes the AC electronic trip unit inoperable in DC applications. Certain DC circuit breakers such as DC air circuit breakers have used a DC electronic trip unit in combination with a shunt to sense the DC current in the protected circuit. The DC electronic trip unit provides enhanced control and tripping accuracy of the circuit breaker over thermal and magnetic trip units. However, DC circuit breakers which include a DC electronic trip unit are costly as compared to the high volume and readily available AC electronic trip units.

Photovoltaic applications present difficulties for current DC circuit breakers. In photovoltaic applications, the short circuit current level can be relatively low (e.g., less than 200% of the rated current and usually about 125% to 135% of the rated current). Due to the relatively low short circuit current level, DC circuit breakers which use thermal and magnetic trip units are typically not desirable because it is difficult to set the magnetic trip unit precisely at these low levels and could cause excessive nuisance tripping and the thermal trip unit may not offer adequate protection due to the long time it takes to trip the circuit breaker. While a DC circuit breaker which uses a DC electronic trip unit can offer suitable circuit protection in photovoltaic applications, the cost of the DC circuit breaker with a DC electronic trip unit is a concern.

There is room for improvement in electrical switching apparatus, such as circuit breakers.

SUMMARY

These needs and others are met by embodiments of the disclosed concept in which an electrical switching apparatus having an electronic trip circuit includes a transductor circuit and an alternating current electronic trip circuit used for direct current applications.

In accordance with one aspect of the disclosed concept, an electrical switching apparatus comprises: a plurality of first terminals including two input terminals structured to electrically connect to a direct current power source; a plurality of second terminals including two output terminals structured to electrically connect to a direct current load; a plurality of pairs of separable contacts; a plurality of conductors that electrically connect each pair of separable contacts between one of the first terminals and one of the second terminals; a transductor circuit that senses a direct current between at least one of the input terminals and at least one of the output terminals and outputs an alternating current proportional to the direct current; and an alternating current electronic trip circuit structured to control the plurality of pairs of separable contacts to separate based on the alternating current output from the transductor circuit, the alternating current electronic trip circuit including a rectifier circuit having a rectifier circuit input and a rectifier circuit output, the rectifier circuit input being electrically connected to the transductor circuit, an interface circuit having an interface circuit input and an interface circuit output, the interface circuit input being electrically connected to the rectifier circuit output, and a processor having a processor input electrically connected to the interface circuit output, the processor being structured to output a control signal to control the plurality of pairs of separable contacts to separate.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "electrical conductor" shall mean a wire (e.g., without limitation, solid; stranded; insulated; non-insulated), a copper conductor, an aluminum conductor, a suitable metal conductor, or other suitable material or object that permits an electric current to flow easily.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "processor" shall mean a programmable analog and/or digital device that can store, retrieve, and process data; a computer; a workstation; a personal computer; a controller; a digital signal processor; a microprocessor; a microcontroller; a microcomputer; a central processing unit; a mainframe computer; a mini-computer; a server; a networked processor; or any suitable processing device or apparatus.

Figure 1:
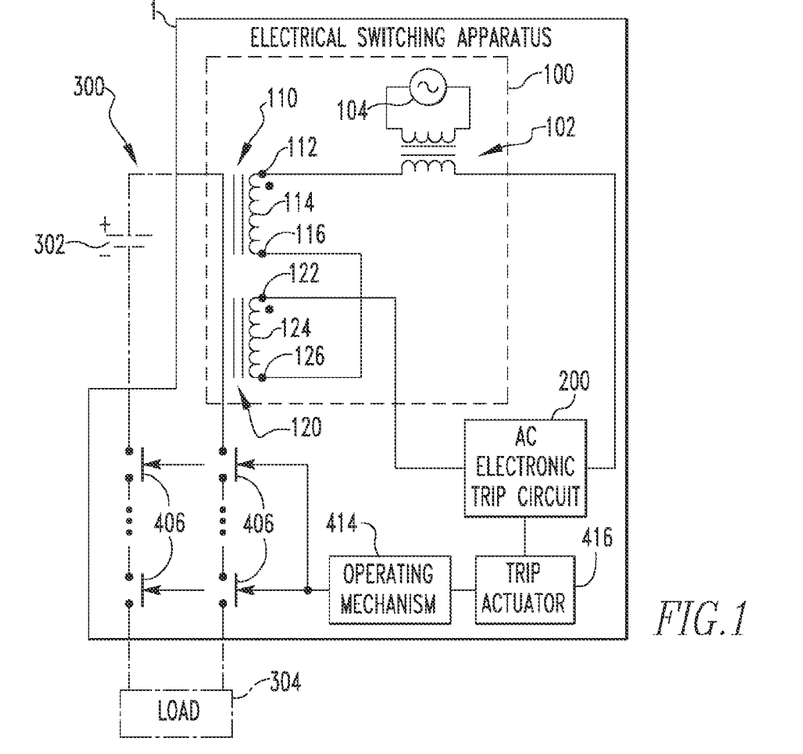
FIG. 1 is a circuit diagram of an electrical switching apparatus in accordance with an embodiment of the disclosed concept.

FIG. 1 is a circuit diagram of an electrical switching apparatus which can be, for example and without limitation, a circuit breaker. The electrical switching apparatus 1 is electrically connected to a protected circuit 300 (shown in phantom line drawings). The protected circuit 300 includes a DC power source 302 and a DC load 304. The electrical switching apparatus 1 includes one or more pairs of separable contacts 406. The electrical switching apparatus 1 also includes an operating mechanism 414 that opens and closes the one or more pairs of separable contacts 406 and a trip actuator 416 that cooperates with the operating mechanism 414 to trip open the one or more pairs of separable contacts 406. The electrical switching apparatus 1 senses a DC current in the protected circuit 300, and based on the sensed DC current, separates the one or more pairs of separable contacts 406 to interrupt the protected circuit 300.

The electrical switching apparatus 1 includes a transductor circuit 100 which is inductively coupled with the protected circuit 300. The transductor circuit 100 outputs an AC current which is proportional to the DC current flowing in the protected circuit 300. As such, the AC current output by the transductor circuit 100 can be used to determine a level of the DC current in the protected circuit 300.

The electrical switching apparatus 1 also includes an AC electronic trip circuit 200. The AC electronic trip circuit 200 is electrically connected to the transductor circuit 100 and receives the AC current output by the transductor circuit 100. The AC electronic trip circuit 200 determines a level of the DC current in the protected circuit 300 based on the AC current received from the transductor circuit 100. Thus, based on the AC current received from the transductor circuit 100, the AC electronic trip circuit 200 controls the one or more pairs of separable contacts 406 to separate. The AC electronic trip circuit 200 provides enhanced control of tripping of the electrical switching apparatus 1 over known prior circuit breakers which use mechanical thermal and magnetic trip units. Furthermore, the AC electronic trip circuit 200 is economical to produce, as similar components can be used for both AC and DC protected circuit applications.

The transductor circuit 100 includes a first current transformer 110 and a second current transformer 120. The first current transformer 110 and the second current transformer 120 include respective secondary windings 114 and 124 which are inductively coupled with the protected circuit 300. The first current transformer 110 and the second current transformer 120 are electrically connected in series opposition with each other such that an electromotive force induced in the first current transformer 110 by the DC current in the protected circuit 300 is opposed to an electromotive force induced in the second current transformer 120 by the DC current in the protected circuit 300. By the cancellation of the electromotive forces, this arrangement electrically neutralizes the transformer effect. The transductor circuit can also be designed in a fashion that it magnetically neutralizes the transformer effect.

Figure 6:
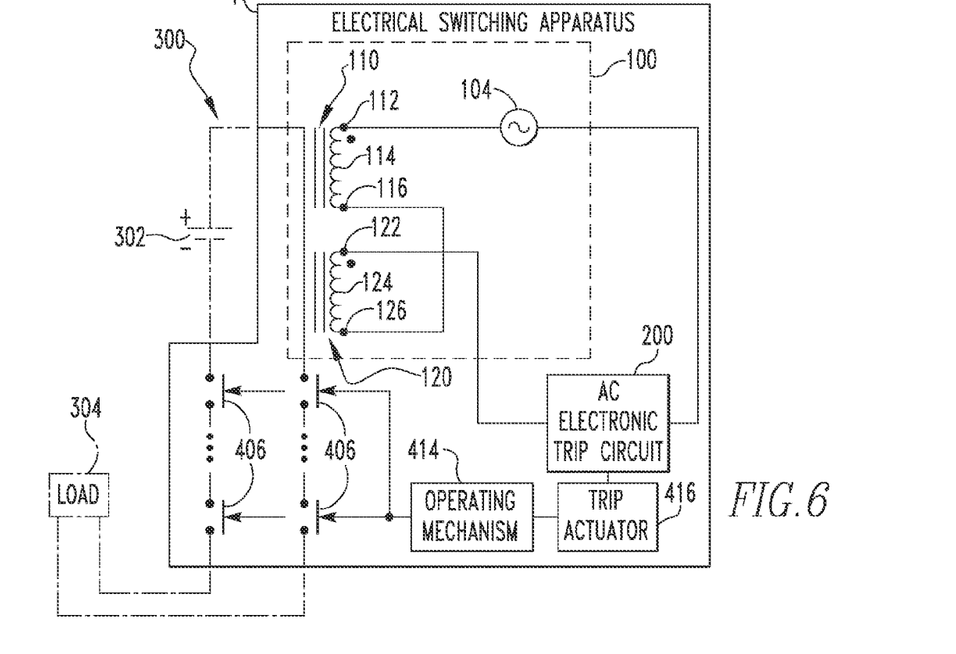
FIGS. 6 and 7 are circuit diagrams of electrical switching apparatuses in accordance with other embodiments of the disclosed concept.
Figure 7:
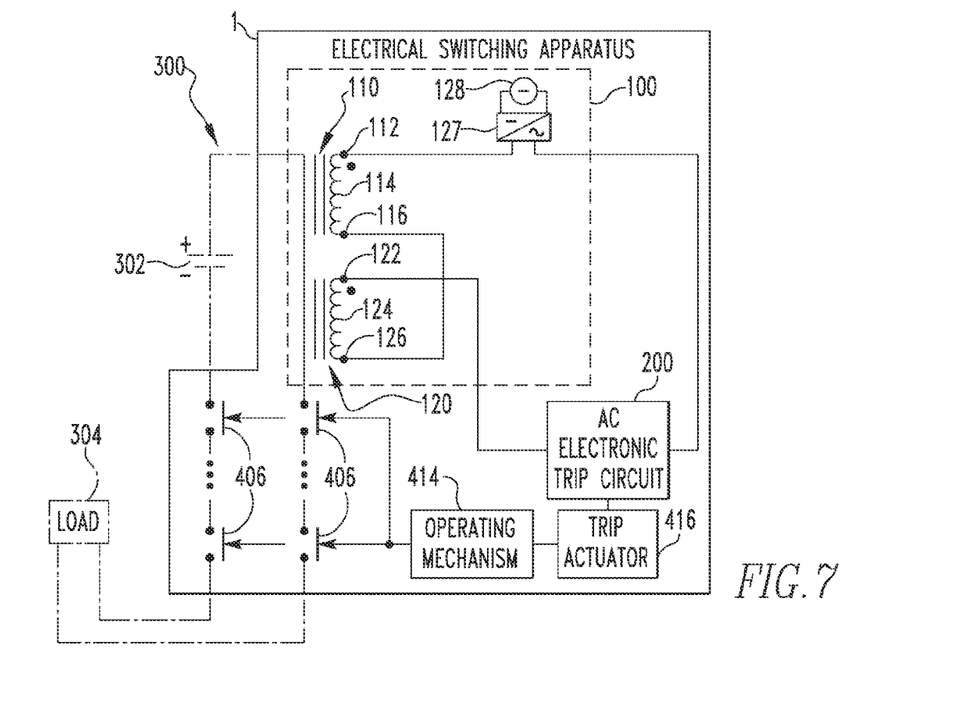

The transductor circuit 100 also includes a power source which provides an AC voltage to the secondary windings of the first and second AC current transformers 110, 120. In the example shown in FIG. 1, the power source includes an AC power source 104 and a third transformer 102 to isolate the AC power source 104 from the first and second AC current transformers 110, 120. Arranging the AC current transformers 110, 120 in series opposition with each other and providing the AC power source 104 causes the transductor circuit 100 to output an AC current which is proportional to the DC current in the protected circuit 300. It is contemplated that any suitable power source may be employed to provide the AC voltage to the secondary windings of the first and second AC current transformers 110, 120. For example, in one non-limiting example embodiment shown in FIG. 6, the third transformer 102 is omitted from the power source and the AC power source 104 is electrically connected to the secondary winding of the first AC current transformer 110. In another non-limiting example embodiment shown in FIG. 7, the power source includes a DC/AC inverter 127 which is electrically connected to the secondary winding of the first AC current transformer 110 and converts a DC voltage generated by a second DC power source 128 into an AC voltage.

The secondary windings 114 and 124 of the current transformers 110, 120 have first ends 112 and 122 and second ends 116 and 126, respectively. In the example shown in FIG. 1, the first end 112 of the first current transformer 110 is electrically connected to the third transformer 102. The second end 116 of the first current transformer 110 is electrically connected to the second end 126 of the second current transformer 120. The first end 122 of the second current transformer 120 is electrically connected to the AC electronic trip circuit 200. In the example shown in FIG. 5, the electrical connection between the first current transformer 110 and the second transformer 120 is changed such that the second end 116 of the first current transformer 110 is electrically connected to the first end 122 of the second current transformer 120 and the second end 126 of the second current transformer 120 is electrically connected to the AC electronic trip circuit 200. However, in both the examples shown in FIGS. 1 and 5, the first current transformer 110 and the second current transformer 120 are electrically connected in series opposition with each other with respect to the electromotive forces induced by the DC current in the protected circuit 300.

Figure 2:
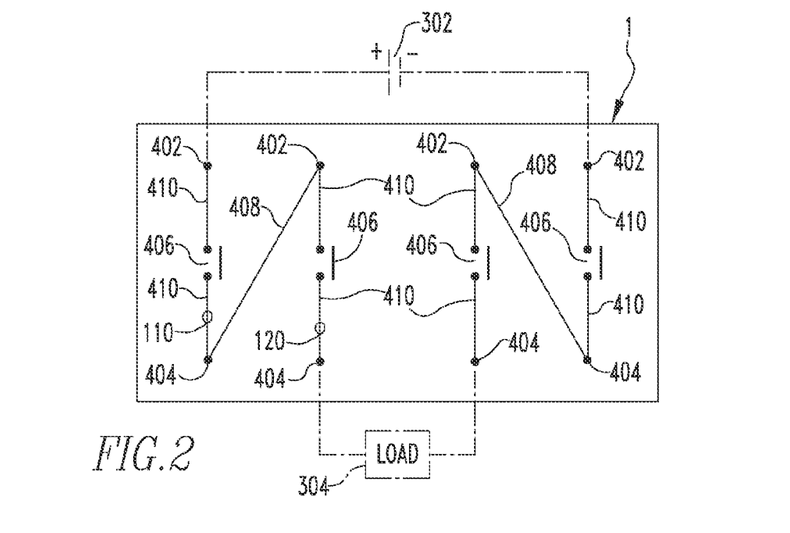
FIGS. 2 and 3 are schematic diagrams of different configurations of an electrical switching apparatus in accordance with another embodiment of the disclosed concept.
Figure 3:
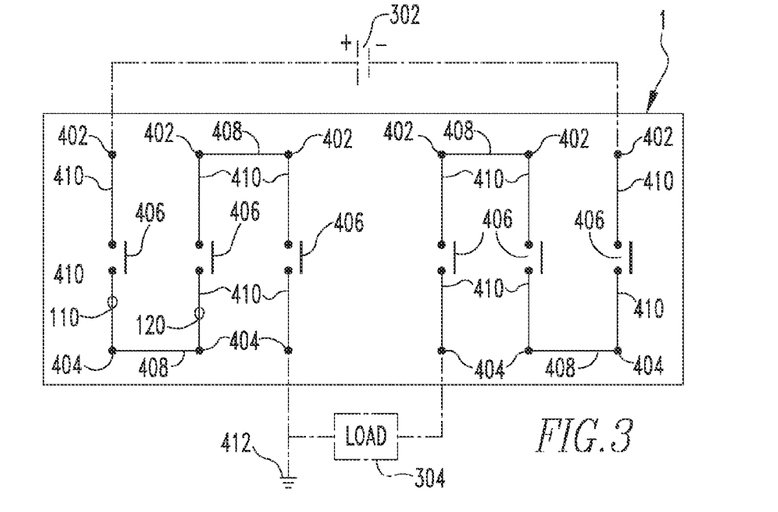
Figure 4:
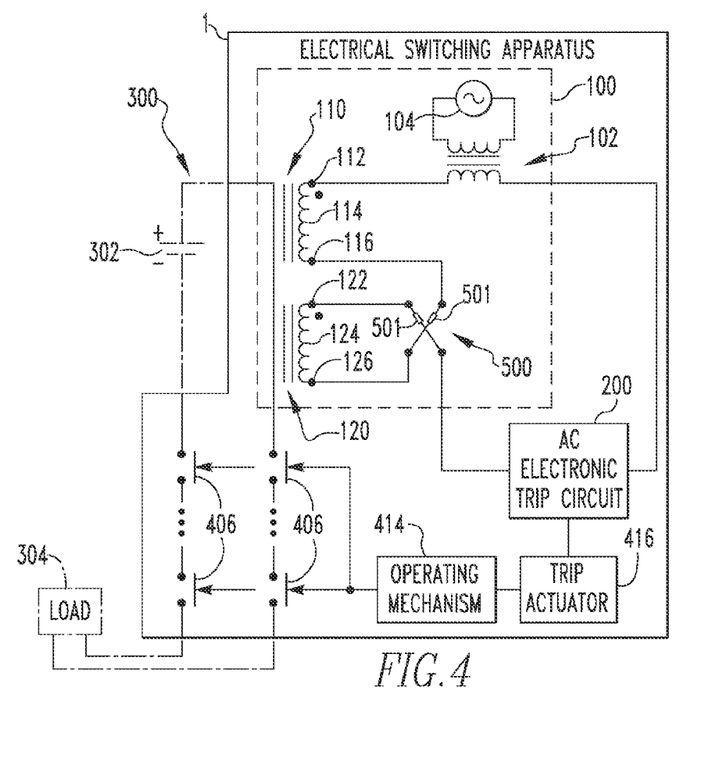
FIGS. 4 and 5 are circuit diagrams of an electrical switching apparatus including configuration plugs in accordance with another embodiment of the disclosed concept.

Referring to FIGS. 2-4, examples of different configurations of the electrical switching apparatus 1 are shown. FIGS. 2 and 3 show schematics of a conductive path in the electrical switching apparatus 1. The conductive path includes first terminals 402, second terminals 404, pairs of separable contacts 406, jumpers 408, and conductors 410. Two of the first terminals 402 are input terminals which are configured to electrically connect to the DC power source 302. Two of the second terminals 404 are output terminals which are structured to electrically connect to the DC load 304. The first terminals 402, second terminals 404, pairs of separable contacts 406, jumpers 408, and conductors 410 are connected in series to complete a circuit between the DC power source 302 and DC load 304.

The first current transformer 110 and the second current transformer 120 are inductively coupled to at least one of the conductors 410. While FIGS. 2 and 3 show two example placements of the first current transformer 110 and the second current transformer 120, the disclosed concept is not limited to those example placements. The first current transformer 110 and the second current transformer 120 may be placed at a suitable location in order to inductively couple to any of the conductors 410.

In the example shown in FIG. 2, the jumpers 408 are each connected between one of the first terminals 402 and one of the second terminals 404. The configuration of jumpers 408 shown in the example of FIG. 2 is generally suitable for a potentially ungrounded load where the DC load 304 is not electrically connected to a ground 412. In the example shown in FIG. 3, the jumpers 408 are each connected between two of the first terminals 402 or two of the second terminals 404. The configuration of jumpers 408 shown in the example of FIG. 3 is generally suitable for a potentially grounded load where the DC load 304 is electrically connected to a ground 412.

The change in configuration of the jumpers 408 between the examples shown in FIGS. 2 and 3 changes the direction of the electromotive force induced in one of the current transformers 110, 120. As such, when the configuration of the jumpers 408 is changed between the example shown in FIG. 2 and the example shown in FIG. 3, the electrical connection between the first current transformer 110 and the second current transformer 120 should also be changed to keep the first current transformer 110 and the second current transformer 120 electrically connected in series opposition so that it neutralizes the transformer effect.

Figure 5:
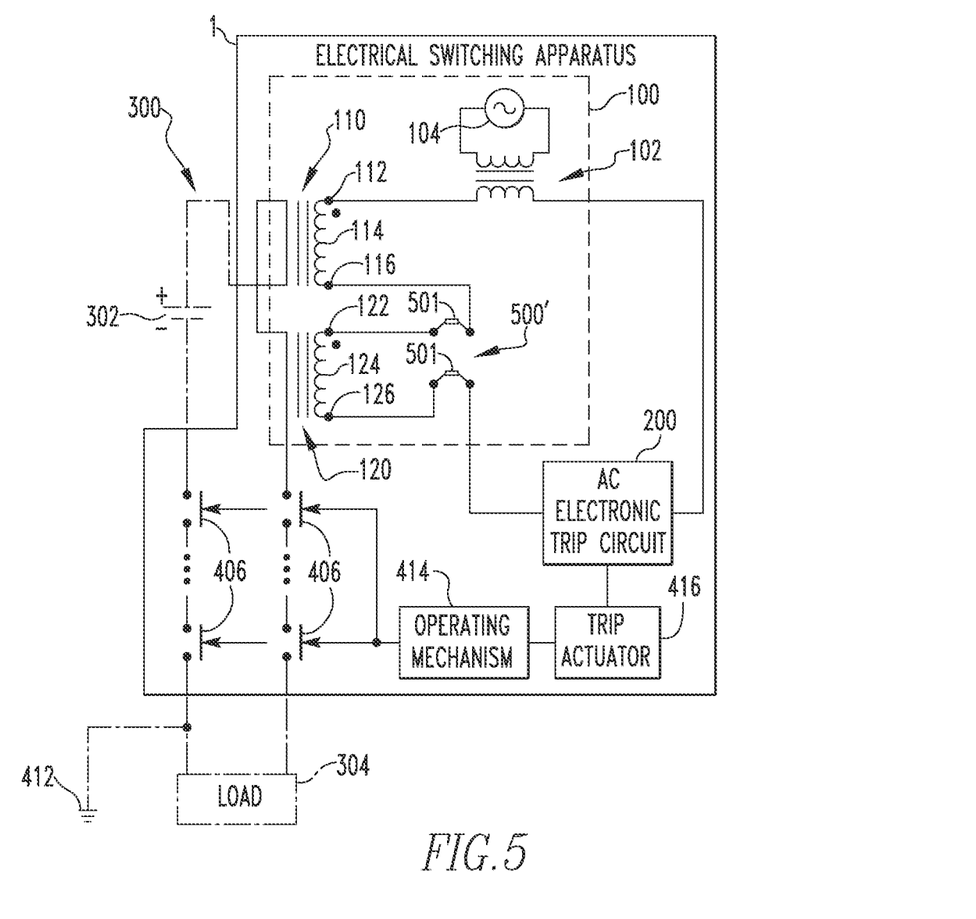

To facilitate changing the electrical connection between the first current transformer 110 and the second current transformer 120, configuration plugs 500 and 500', as shown in respective FIGS. 4 and 5, are included in the electrical switching apparatus 1. In the example shown in FIG. 4, the configuration plug 500 electrically connects the secondary windings of the first current transformer 110 and the second current transformer 120 in the same manner as shown in FIG. 1. In the example shown in FIG. 5, the configuration plug 500' electrically connects the second end 116 of the first current transformer 110 with the first end 122 of the second current transformer 120 and the second end 126 of the second current transformer 120 with the AC electronic trip circuit 200.

The configuration plugs 500 and 500' can form a configuration plug set where the configuration plugs 500 and 500' respectively correspond to a different configuration of the electrical switching apparatus 1. For example, the first configuration plug 500 can be used in conjunction with the example configuration of the electrical switching apparatus 1 shown in FIG. 2 and the second configuration plug 500' can be used in conjunction with the example configuration of the electrical switching apparatus 1 shown in FIG. 3.

In addition to changing the electrical connection between the first current transformer 110 and the second current transformer 120, the configuration plugs 500 and 500' can each include resistors 501. A resistance value of the resistors 501 can be selected to correspond to a rating of the electrical switching apparatus 1 so that the voltage drop across the resistors at the rated DC current stays at a constant value. As such, the configuration plug set can include different configuration plugs which correspond to electrical connections between the first current transformer 110 and the second current transformer 120, and also can correspond to different ratings of the electrical switching apparatus 1.

Figure 8:
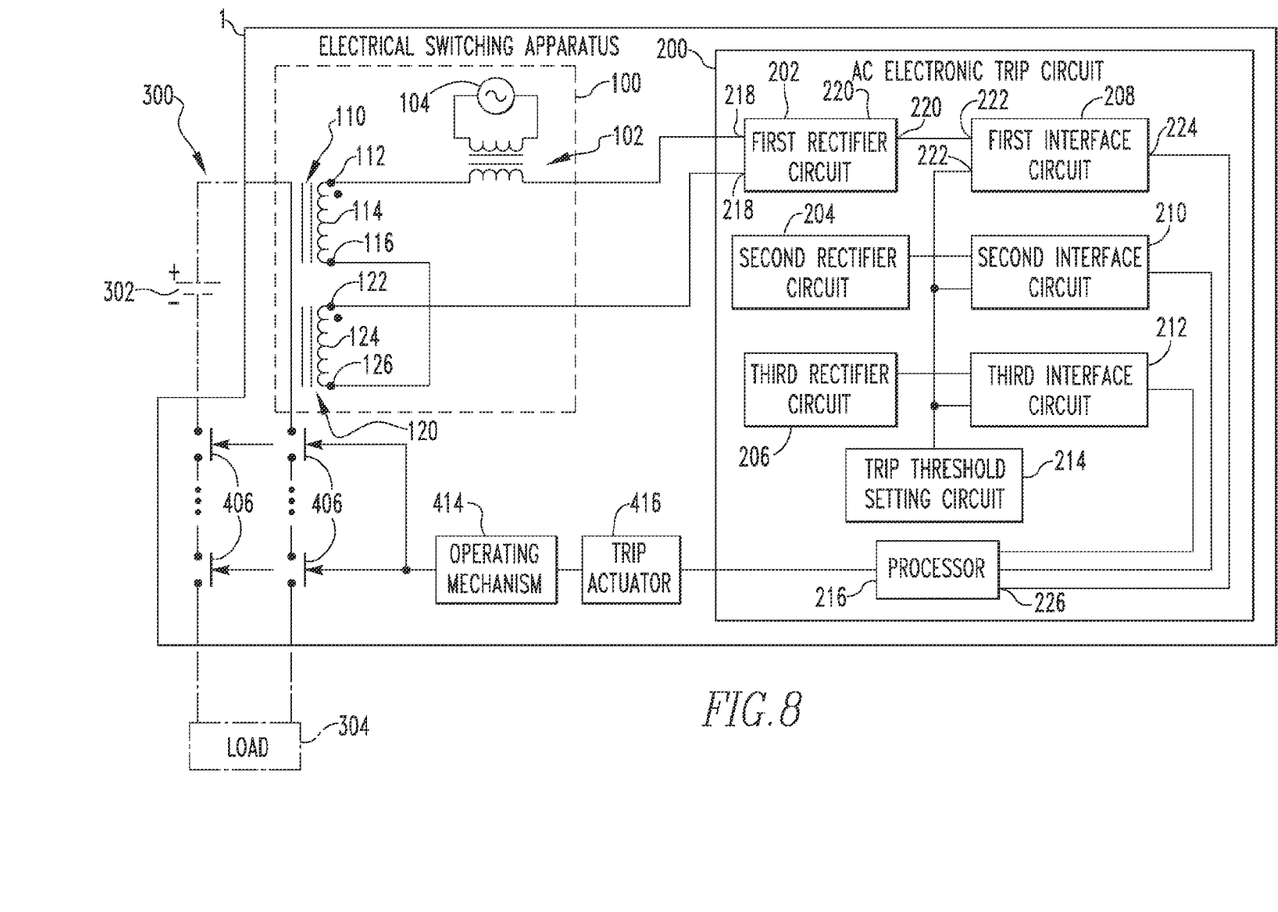
FIG. 8 is a circuit diagram of an electrical switching apparatus electrically connected to a potentially ungrounded load and including an alternating current (AC) electronic trip circuit in block form in accordance with an embodiment of the disclosed concept.

Referring to FIG. 8, the electrical switching apparatus 1 is configured for use with the potentially ungrounded direct current load 304. The AC electronic trip circuit 200 includes first, second, and third rectifier circuits 202,204,206, first, second, and third interface circuits 208,210,212, a trip threshold setting circuit 214, and a processor 216.

The first rectifier circuit 202 includes a first rectifier circuit input 218 and a first rectifier circuit output 220. The first rectifier circuit input 218 is electrically connected to the transductor circuit 100 and is structured to receive the alternating current output from the transductor circuit 100. The first rectifier circuit 202 rectifies the alternating current and outputs the rectified alternating current to the first rectifier circuit output 220.

The first interface circuit 208 includes a first interface circuit input 222 and a first interface circuit output 224. The first interface circuit input 222 is electrically connected to the first rectifier circuit output 220 and is structured to receive the rectified alternating current. The first interface circuit input 222 is also electrically connected to the trip threshold setting circuit 214. The trip threshold setting circuit 214 is structured to set a threshold at which the processor 216 controls the trip actuator 416 to cause the operating mechanism 414 to separate and open the separable contacts 406. The first interface circuit output 224 is electrically connected to a first processor input 226 of the processor 216.

The processor 216 is structured to monitor the first processor input 226 and to determine whether a trip condition (e.g., without limitation, an over current condition) exists. When the processor 216 determines that a trip condition exists, it outputs a control signal to the trip actuator 416 to control the trip actuator 416 to cause the operating mechanism 414 to separate and open the separable contacts 406.

The second and third rectifier circuits 204,206 are structured similar to the first rectifier circuit 202 and the second and third interface circuits 210,212 are structured similar to the first interface circuit 208. When the AC electronic trip circuit 200 is employed in a three-phase AC application, each of the first, second, and third rectifier circuits 202,204,206 correspond to one of the phases. However, when the AC electronic trip circuit 200 is employed in a DC application, as shown for example in FIG. 8, the output of the transductor circuit 100 only needs to electrically connect to one of the first, second, and third rectifier circuits 202,204,206 and the others are not used.

Figure 9:
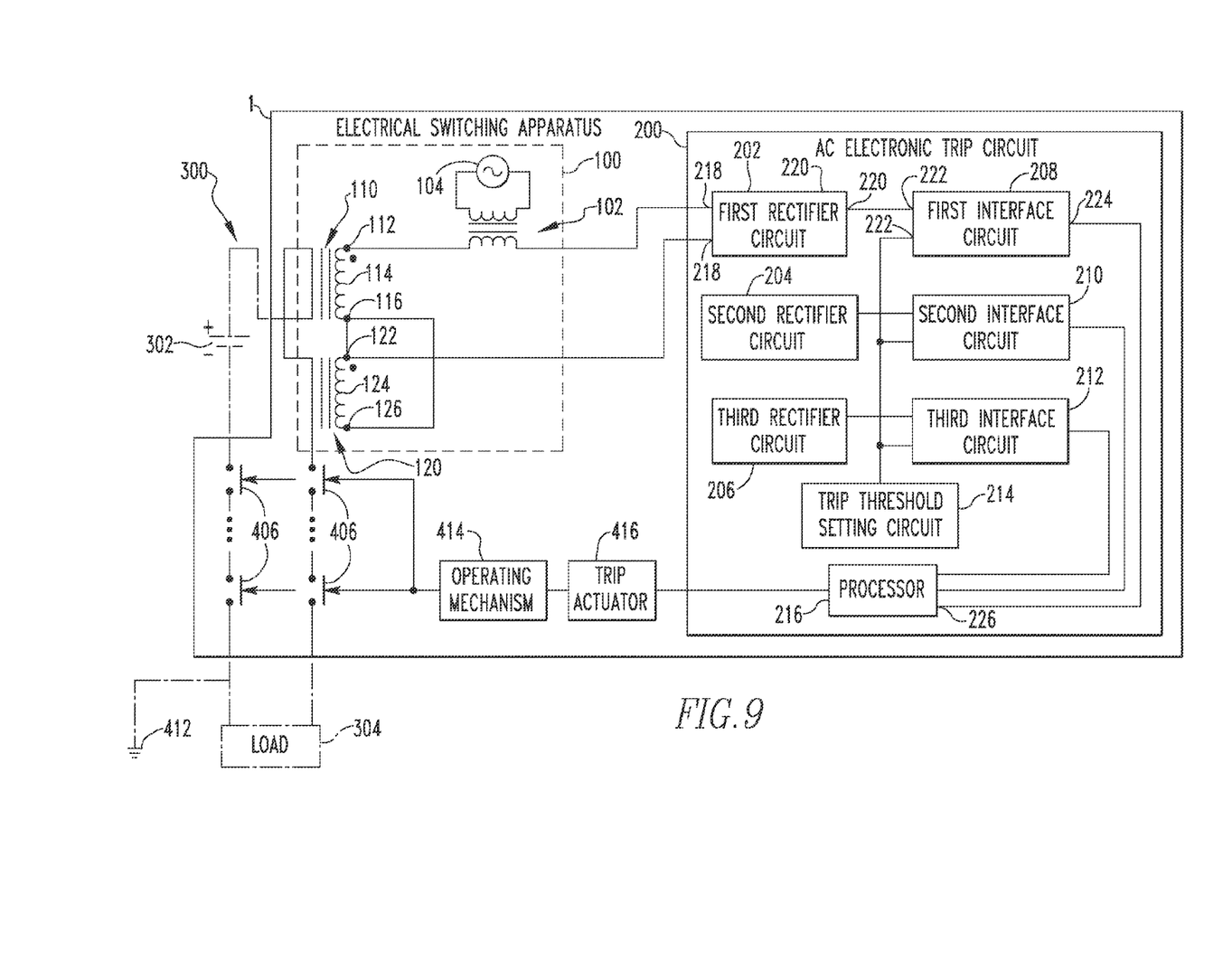
FIG. 9 is a circuit diagram of an electrical switching apparatus electrically connected to a potentially grounded load and including an AC electronic trip circuit in block form in accordance with an embodiment of the disclosed concept.

Referring to FIG. 9, an example of a different configuration of the electrical switching apparatus 1 is shown. In FIG. 9, the electrical switching apparatus 1 has a configuration that is generally suitable for a potentially grounded load where the DC load 304 is electrically connected to a ground 412.

Figure 10:
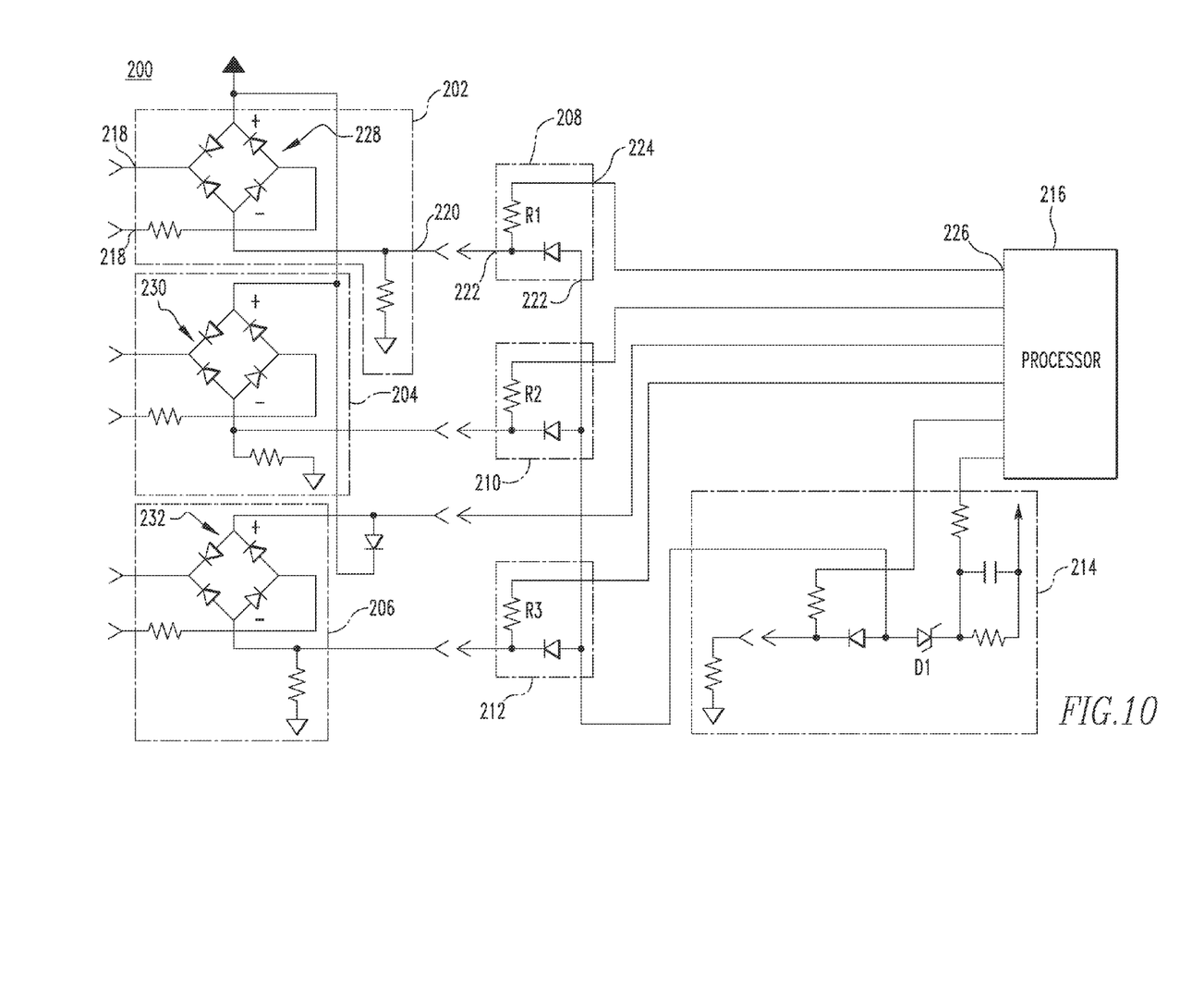
FIG. 10 is a circuit diagram of an AC electronic trip circuit in accordance with an embodiment of the disclosed concept.

FIG. 10 is a circuit diagram of the AC electronic trip circuit 200 in accordance with an example embodiment of the disclosed concept. The first rectifier circuit includes a full-wave rectifier 228.

The first interface circuit 208 includes a resistor R1 electrically connected between the first interface input 222 and the first interface output 224. Changing the value of the resistor R1 changes the magnitude of the current at the first processor input 226. The processor 216 can be programmed based on receiving a predetermined level of current at the first processor input 226 when a rated current flows through the protected circuit. Generally, the processor 216 will be programmed based on an AC application. That is, the processor 216 will be programmed based on receiving a current having a first value at the first processor input 226 when a rated AC current flows through the protected circuit. However, the output of the transductor circuit 100 when a rated DC current flows through the protected circuit will be different than the output of the current transformers used in an AC application. To avoid reprogramming the processor 216, the value of the resistor R1 can be selected in order that the current at the first processor input 226 is substantially the same as the first value when a rated DC current flows through the power circuit. In one example embodiment, the value of the resistor R1 is about 6.3 kΩ.

The second and third rectifier circuits 204,206 also include full-wave rectifiers 230,232 similar to the full-wave rectifier 228 in the first rectifier circuit 202. The second and third interface circuits 210,212 also include resistors R2,R3 similar to the resistor R1 in the first interface circuit 208. While the second and third rectifier circuits 204,206 and the second and third interface circuits 210,212 are not used in the disclosed electrical switching apparatus 1, it will be appreciated by those having ordinary skill in the art that the output of the transductor circuit 100 may be electrically connected to any one of the first, second, or third rectifier circuits 202,204,206.

The trip threshold setting circuit 214 includes a zener diode D1. The override threshold for instantaneous trip is based on the breakdown voltage of the zener diode. In one example embodiment, the zener diode has a breakdown voltage of about 2.7 V.

Figure 11:
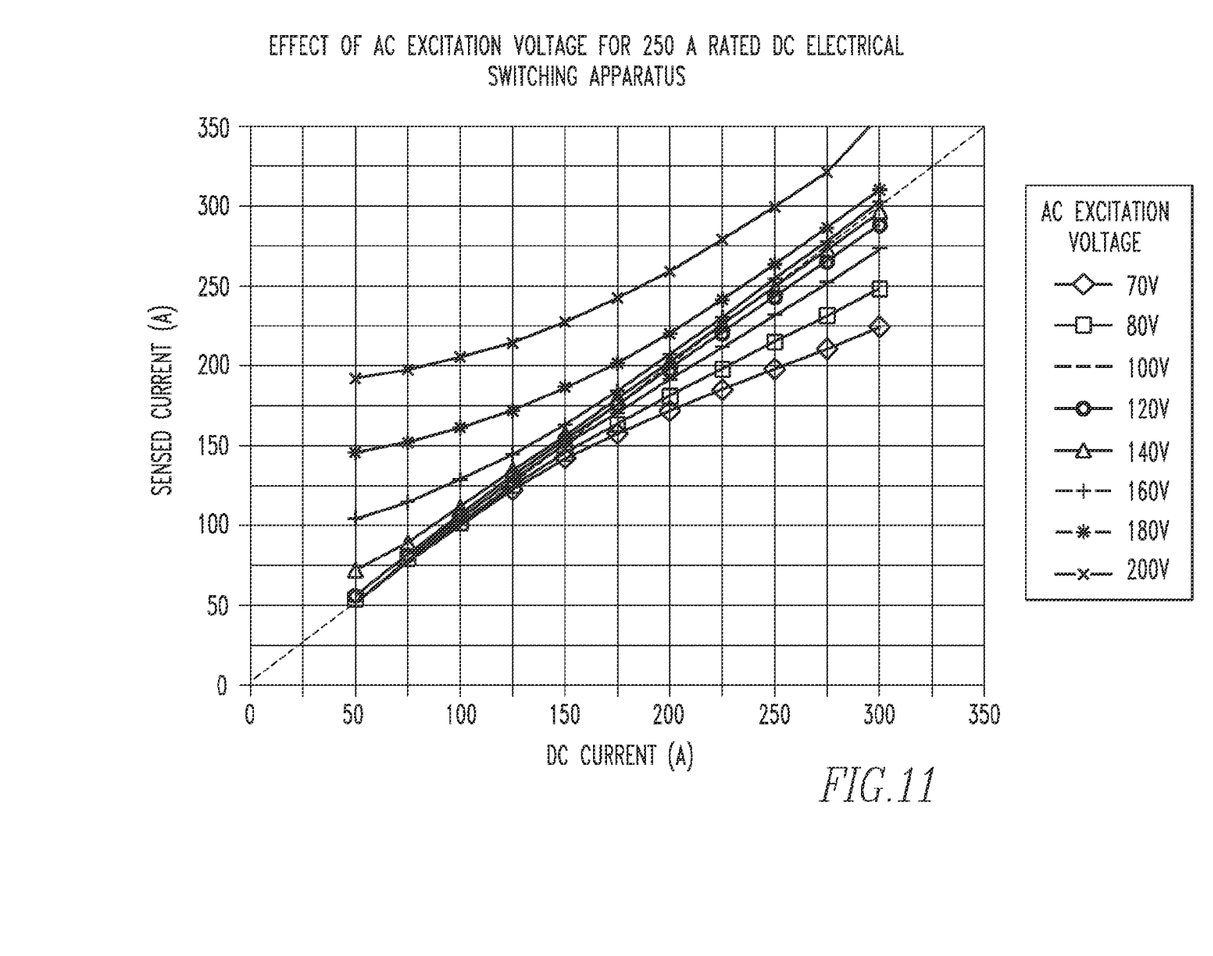
FIG. 11 is an example graph of sensed direct current versus actual direct current for different alternating current excitation voltages in a transductor circuit.

FIG. 11 shows an example plot of the effects of changing the AC voltage provided to the secondary windings of the first and second AC current transformers 110,120 (also referred to as the AC excitation voltage) for a 250 A rated electrical switching apparatus. The horizontal axis of the plot corresponds to the actual direct current flowing through the protected circuit and the vertical axis of the plot corresponds to the current that the processor 216 senses flowing through the protected circuit. Ideally, the actual and sensed current would be the same. In the example shown in FIG. 11, it was experimentally determined that the sensed current closely tracks the actual current at an AC excitation voltage of about 135 $V_{RMS}$. As the AC excitation voltage moves further away from 135 $V_{RMS}$, the differences between the sensed current and the actual current become more significant. Experimentation and/or simulation may be used to determine an acceptable AC excitation voltage or range of excitation voltages for a particular application. In one example embodiment of the disclosed concept, the AC excitation voltage is within a range of about 121.5 $V_{RMS}$ to about 148.5 $V_{RMS}$. In another example embodiment of the disclosed concept, the AC excitation voltage is within a range of about 288 $V_{RMS}$ to about 352 $V_{RMS}$. In yet another example embodiment of the disclosed concept, the AC excitation voltage is within a range of about ±10% of a predetermined value (e.g., without limitation, 135 $V_{RMS}$; 320 $V_{RMS}$).

Although separable contacts 406 are disclosed, suitable solid state separable contacts can be employed. For example, the disclosed electrical switching apparatus 1 includes a suitable circuit interrupter mechanism, such as the separable contacts 406 that are opened and closed by the disclosed operating mechanism 414, although the disclosed concept is applicable to a wide range of circuit interruption mechanisms (e.g., without limitation, solid state switches like FET or IGBT devices; contactor contacts) and/or solid state based control/protection devices (e.g., without limitation, drives; soft-starters; DC/DC converters) and/or operating mechanisms (e.g., without limitation, electrical, electro-mechanical, or mechanical mechanisms).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical switching apparatus comprising:
   a plurality of first terminals including two input terminals structured to electrically connect to a direct current power source;
   a plurality of second terminals including two output terminals structured to electrically connect to a direct current load;
   a plurality of pairs of separable contacts;
   an operating mechanism configured to open and close said separable contacts;
   a trip actuator configured to cooperate with said operating mechanism to trip open said separable contacts;
   a plurality of conductors that electrically connect each pair of separable contacts between one of said first terminals and one of said second terminals;
   a transductor circuit that senses a direct current between at least one of the input terminals and at least one of the output terminals and outputs an alternating current proportional to the direct current; and
   an alternating current electronic trip circuit structured to control the plurality of pairs of separable contacts to separate based on the alternating current output from the transductor circuit, the alternating current electronic trip circuit including a rectifier circuit having a rectifier circuit input and a rectifier circuit output, the rectifier circuit input being electrically connected to the transductor circuit, an interface circuit having an interface circuit input and an interface circuit output, the interface circuit input being electrically connected to the rectifier circuit output, and a processor having a processor input electrically connected to the interface circuit output, the processor being structured to output a control signal to control the trip actuator to cause the operating mechanism to separate and open the plurality of pairs of separable contacts.

2. The electrical switching apparatus of claim 1, wherein the rectifier circuit includes a full-wave rectifier.

3. The electrical switching apparatus of claim 1, wherein the interface circuit includes a resistor electrically connected between the interface circuit input and the interface circuit output; and wherein the resistor has a predetermined value.

4. The electrical switching apparatus of claim 3, wherein the processor is programmed based on receiving a current having a first value at the processor input when a rated current flows through the plurality of conductors; and wherein the predetermined value of the resistor is selected in order that the current received at the processor input substantially has the first value.

5. The electrical switching apparatus of claim 3, wherein the predetermined value of the resistor is about 6.3 kΩ.

6. The electrical switching apparatus of claim 1, wherein the alternating current electronic trip circuit further includes a trip threshold setting circuit structured to set an override threshold at which the processor controls the trip actuator to cause the operating mechanism to instantaneously separate the separable contacts.

7. The electrical switching apparatus of claim 6, wherein the trip threshold setting circuit includes a zener diode; and wherein the override threshold is based on a breakdown voltage of the zener diode.

8. The electrical switching apparatus of claim 7, wherein the breakdown voltage of the zener diode is about 2.7 V.

9. The electrical switching apparatus of claim 1, wherein the plurality of conductors include a first conductor and a second conductor; wherein the transductor circuit includes a first current transformer having a secondary winding inductively coupled with the first conductor, a second current transformer having a secondary winding inductively coupled with the second conductor, and an alternating current power circuit configured to provide an alternating voltage to the first current transformer and the second current transformer; and wherein the secondary windings of the first current transformer and the second current transformer are electrically connected in series-opposition such that an electromotive force induced in the secondary winding of the first current transformer by the direct current is in opposition with an electromotive force induced in the secondary winding of the second current transformer by the direct current.

10. The electrical switching apparatus of claim 9, wherein the alternating voltage is within a range of about 121.5 $V_{RMS}$ to about 148.5 $V_{RMS}$.

11. The electrical switching apparatus of claim 9, wherein the alternating voltage is within a range of about 288 $V_{RMS}$ to about 352 $V_{RMS}$.

12. The electrical switching apparatus of claim 9, wherein the alternating voltage is within a range of about ±10% of a predetermined value.

13. The electrical switching apparatus of claim 9, wherein the alternating current power circuit includes an alternating current power source and a third transformer; and wherein the alternating current power source is configured to provide the alternating voltage to the first current transformer and the second current transformer via the third transformer.

14. The electrical switching apparatus of claim 9, wherein the alternating current power circuit includes a direct current/alternating current inverter and a second direct current power source; and wherein the direct current/alternating current inverter converts a direct current voltage generated by the second direct current power source into said alternating voltage.

15. The electrical switching apparatus of claim 9, wherein the secondary windings of each of the first current transformer and the second transformer include a first end and a second end; wherein the first end of the first current transformer is electrically connected to the third transformer: wherein the second end of the first transformer is electrically connected to the second end of the second transformer; and wherein the first end of the second transformer is electrically connected to the alternating current electronic trip circuit.

16. The electrical switching apparatus of claim 15, wherein the direct current load is potentially ungrounded.

17. The electrical switching apparatus of claim 9, wherein the secondary windings of each of the first current transformer and the second transformer include a first end and a second end; wherein the first end of the first current transformer is electrically connected to the third transformer; wherein the second end of the first transformer is electrically connected to the first end of the second transformer; and wherein the second end of the second transformer is electrically connected to the alternating current electronic trip circuit.

18. The electrical switching apparatus of claim 17, where the direct current load is potentially grounded.

* * * * *